United States Patent
Hsu et al.

(10) Patent No.: US 9,478,711 B2
(45) Date of Patent: Oct. 25, 2016

(54) TRANSPARENT CONDUCTIVE LAYER STRUCTURE OF LIGHT EMITTING DIODE

(71) Applicant: TEKCORE CO., LTD., Nantou (TW)

(72) Inventors: Hai-Wen Hsu, Nantou (TW); Ruei-Ming Yang, Nantou (TW)

(73) Assignee: TEKCORE CO., LTD., Nantou (TW)

(*) Notice: Subject to any disclaimer, the term of this patent is extended or adjusted under 35 U.S.C. 154(b) by 246 days.

(21) Appl. No.: 14/495,010

(22) Filed: Sep. 24, 2014

(65) Prior Publication Data

US 2016/0087157 A1 Mar. 24, 2016

(51) Int. Cl.
*H01L 33/38* (2010.01)
*H01L 33/42* (2010.01)
*H01L 33/44* (2010.01)
*H01L 33/14* (2010.01)
*H01L 33/46* (2010.01)

(52) U.S. Cl.
CPC .............. *H01L 33/42* (2013.01); *H01L 33/44* (2013.01); *H01L 33/145* (2013.01); *H01L 33/38* (2013.01); *H01L 33/46* (2013.01)

(58) Field of Classification Search
CPC ....... H01L 33/38; H01L 33/42; H01L 33/46; H01L 33/145
See application file for complete search history.

(56) References Cited

U.S. PATENT DOCUMENTS

| 2013/0049060 A1* | 2/2013 | Yu | H01L 33/38 257/99 |
| 2013/0234192 A1* | 9/2013 | Kim | H01L 33/0008 257/98 |
| 2015/0008475 A1* | 1/2015 | Lu | H01L 33/38 257/99 |
| 2015/0060913 A1* | 3/2015 | Tsou | H01L 33/20 257/98 |

* cited by examiner

*Primary Examiner* — Thao X Le
*Assistant Examiner* — J. R. Oakley
(74) *Attorney, Agent, or Firm* — Muncy, Geissler, Olds & Lowe, P.C.

(57) ABSTRACT

A transparent conductive layer structure for an LED is provided. The LED includes a reflecting layer, an N-type electrode, an N-type semiconductor layer, a light emitting layer, a P-type semiconductor layer, a current block layer, a transparent conductive layer and a P-type electrode that are stacked on a substrate. The current block layer is disposed between and separates the P-type electrode and the P-type semiconductor layer. The transparent conductive layer is disposed between the P-type electrode and the current block layer, and connects to the P-type electrode and the P-type semiconductor layer. At a region corresponding to the P-type electrode, a plurality of holes are disposed at the transparent conductive layer to reduce an area of and hence an amount of light absorbed by the transparent conductive layer, thereby increasing light extraction efficiency of excited light from the light emitting layer and enhancing light emitting efficiency of the LED.

10 Claims, 7 Drawing Sheets

Fig. 5

TRANSPARENT CONDUCTIVE LAYER STRUCTURE OF LIGHT EMITTING DIODE

FIELD OF THE INVENTION

The present invention relates to a light emitting diode (LED), and more particularly to an LED for enhancing light emitting efficiency.

BACKGROUND OF THE INVENTION

A light emitting diode (LED) is principally formed by multiple epitaxial layers of a light emitting semiconductor material. For example, a blue-light LED is mainly consisted of gallium nitride-based (GaN-based) epitaxial thin films that are stacked into a light emitting body in a sandwich structure. To effectively extract excited light generated by the light emitting body and at the same time enhance light emitting efficiency, LEDs are categorized into horizontal, vertical and flip-chip LEDs.

Figure 1:
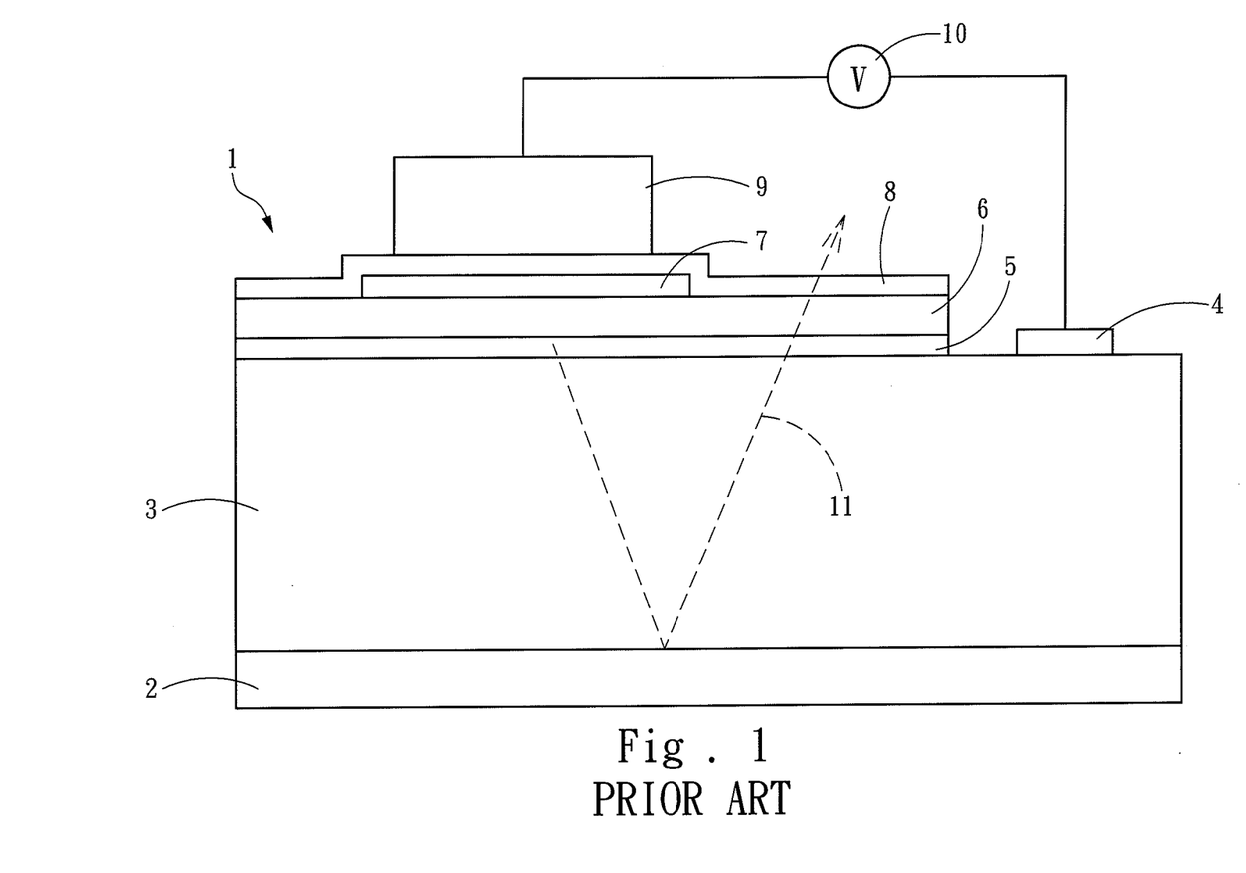
FIG. 1 is a diagram of a structure of a conventional light emitting diode (LED)

Referring to FIG. 1, a conventional horizontal LED 1 includes a reflecting layer 2, an N-type semiconductor layer 3, an N-type electrode 4, a light emitting layer 5, a P-type semiconductor layer 6, a current block layer 7, a transparent conductive layer 8, and a P-type electrode 9. The N-type electrode 4 and the P-type electrode 9 input a voltage difference 10, so as to drive the sandwich structure of the N-type semiconductor layer 3, the light emitting layer 5 and the P-type semiconductor layer 6 to generate excited light 11. The reflecting layer 2 reflects the excited light 11 such that the excited light 11 exits via a same side in a concentrated manner.

To prevent the opaque P-type electrode 9 from excessively shielding the excited light 11 and hence resulting low light extraction efficiency, the P-type electrode 9 is defined with a certain area. However, a current passing through the light emitting layer 5 may get too concentrated if the P-type electrode 9 is too small, in a way that light emitting uniformity and efficiency of the light emitting layer 5 may be unsatisfactory. Therefore, to maintain the light uniformity and efficiency of the light emitting layer 5 and to at the same time reduce the shielding area of the P-type electrode 9, the P-type electrode 9 needs to be applied in collaboration with the transparent conductive layer 8 that is both conductive and transparent. Alternatively, the transparent conductive layer 8 may be directly implemented as the P-type electrode 9. When a current is induced from the P-type electrode 9, the current is allowed to diffuse via the transparent conductive layer 8 to enhance the light emitting uniformity and efficiency of the light emitting layer 5.

Nonetheless, as most of the current takes a shortest route, i.e., travels from the P-type electrode 9 directly downwards to pass through the transparent conductive layer 8, the diffusion achieved by the transparent conductive layer 8 is quite limited. To promote the diffusion within the transparent conductive layer 8, the current block layer 7 is conventionally disposed between the transparent conductive layer 8 and the P-type semiconductor 8, at a a region of the P-type electrode 9. The current block layer 7 blocks the current from passing through, and so the current is forced to detour along the current block layer 7 to be diffused at the transparent conductive layer 8, thereby enhancing the light emitting uniformity and brightness of the light emitting layer 5.

The transparent conductive layer 8 is generally made of indium tin oxide (ITO). Although being a transparent material, ITO does not have a high transparency. That is, ITO tends to absorb light. For the above structure, when the transparent conductive layer 8 is made of ITO, the diffusion of the current can be promoted to enhance the light emitting uniformity and efficiency, with however a considerable amount of light loss being resulted meantime as well. More particularly, when the excited light 11 is reflected for a number of times in the LED 1 and hence passes through the transparent conductive layer 8 for a number of times, a significant amount of light loss is resulted.

SUMMARY OF THE INVENTION

Therefore, the primary object of the present invention is to partially remove the transparent conductive layer, so as to reduce the area of the transparent conductive layer as well as the amount of light absorbed by the transparent conductive layer, thereby increasing the amount of effective extracted light of the excited light of the light emitting layer and enhancing the light emitting efficiency of the LED.

The present invention provides a transparent conductive layer structure applied to an LED. The LED includes a reflecting layer, an N-type electrode, an N-type semiconductor layer, a light emitting layer, a P-type semiconductor layer, a current block layer, a transparent conductive layer and a P-type electrode, which are all sequentially stacked on a substrate. The reflecting layer is located on the substrate. The N-type semiconductor layer is located on the reflecting layer, and includes divided areas respectively connected to the N-type electrode and the light emitting layer. The P-type semiconductor is located on the light emitting layer. The current block layer is located on the P-type semiconductor layer, and has a pattern corresponding to and completely covering the P-type electrode. The transparent conductive layer covers the current block layer, and is connected to the P-type semiconductor. The P-type electrode is located on the transparent conductive layer. A feature of the present invention is that, a plurality of holes are disposed at the transparent conductive layer at a region corresponding to the P-type electrode.

The region corresponding to the P-type electrode is a shielding area that is light-impervious. However, light can still exit after multiple reflections. Thus, in the present invention, the transparent conductive layer corresponding to the P-type electrode is partially removed to keep another part of the transparent conductive electrode to electrically connect to the P-type electrode. As such, by reducing the area of the transparent conductive layer, the amount of the light absorbed by the transparent conductive layer can be decreased to further enhance the overall light extraction efficiency.

DETAILED DESCRIPTION OF THE PREFERRED EMBODIMENTS

The foregoing, as well as additional objects, features and advantages of the invention will be more readily apparent from the following detailed description, which proceeds with reference to the accompanying drawings.

Figure 2A:
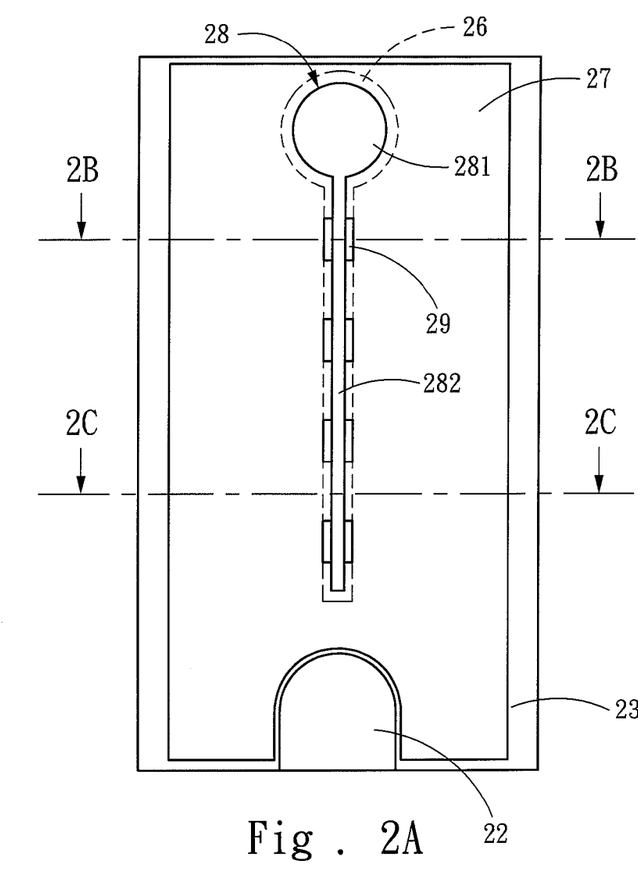
FIG. 2A is a top view of a structure of an LED of the present invention.
Figure 2B:
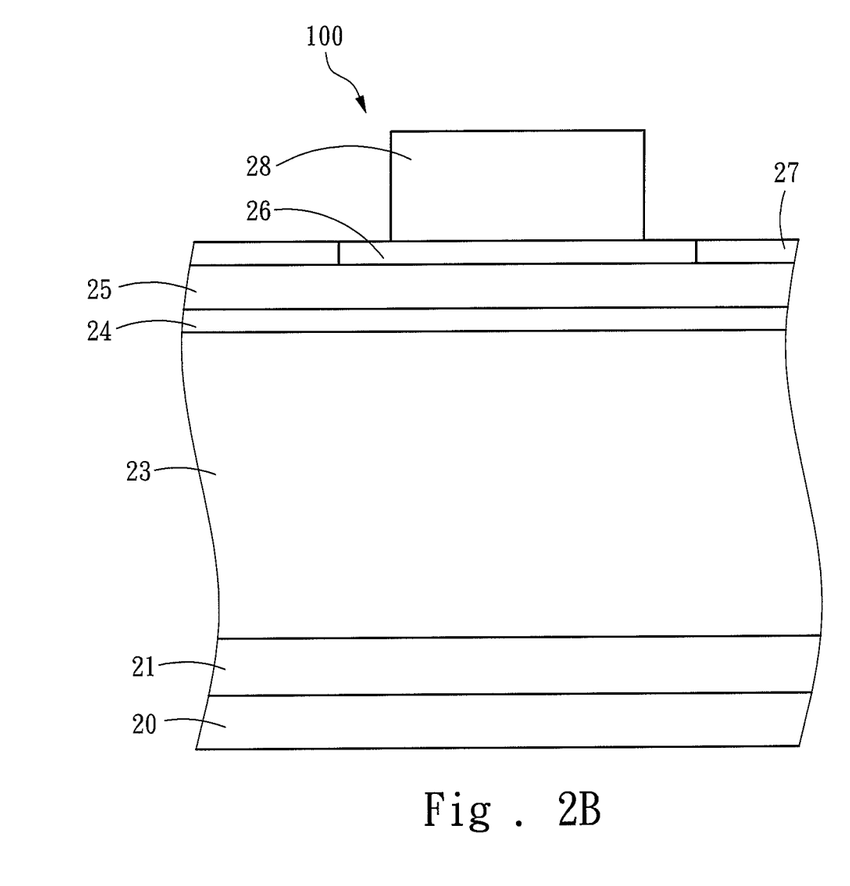
FIG. 2B is a section view along 2B-2B of FIG. 2A of the present invention.
Figure 2C:
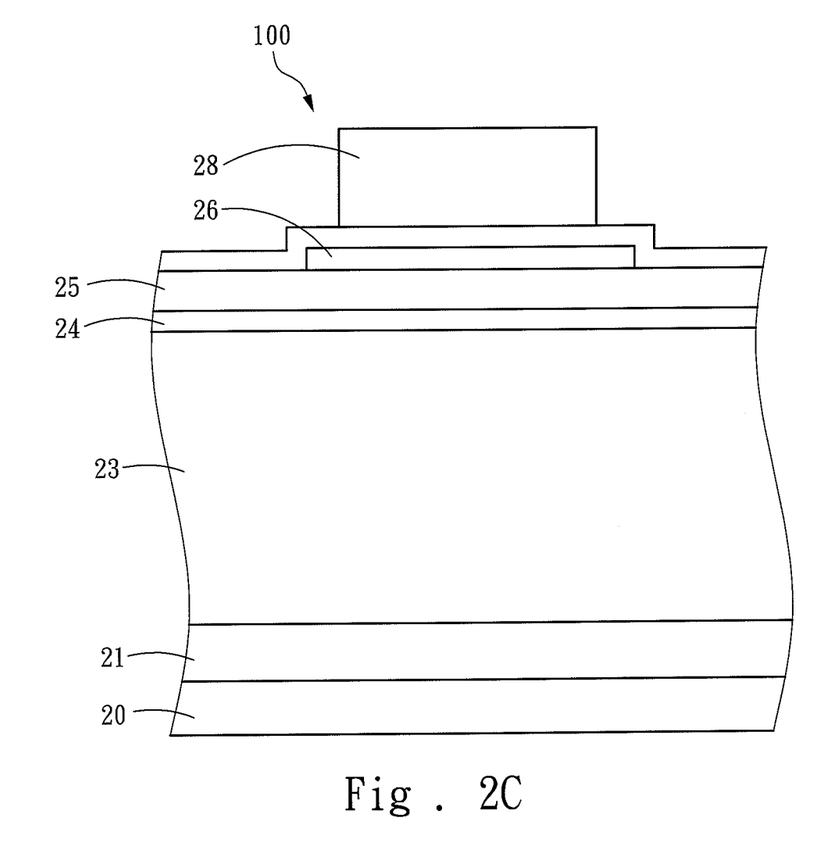
FIG. 2C is a section view along 2C-2C of FIG. 2A of the present invention.

Referring to FIG. 2A, FIG. 2B and FIG. 2C, a transparent conductive layer structure of a light emitting diode (LED) is applied to an LED 100. The LED 100 includes a reflecting layer 21, an N-type electrode 22, an N-type semiconductor layer 23, a light emitting layer 24, a P-type semiconductor layer 25, a current block layer 26, a transparent conductive layer 27 and a P-type electrode 28, which are all stacked on a substrate 20. The reflecting layer 21 is located on the substrate 20. The N-type semiconductor layer 23 is located on the reflecting layer 21, and includes divided areas respectively connected to the N-type electrode 22 and the light emitting layer 24. The P-type semiconductor layer 25 is located on the light emitting layer 24. The current block layer 26 is located on the P-type semiconductor layer 25, and has a pattern corresponding to and completely covering the P-type electrode 28. The transparent conductive layer 27 covers the current block layer 26 and is connected to the P-type semiconductor layer 25. The P-type electrode 28 is located on the transparent conductive layer 27.

A feature of the present invention is that, at a region corresponding to the P-type electrode 28, a plurality of holes 29 are disposed at the transparent conductive layer 27, in a way that only a part of the transparent conductive layer 27 is preserved to electrically connect to the P-type electrode 28. For electrical considerations, the part of the transparent conductive layer 27 connected to the P-type electrode 28 needs to be in a sufficient amount. More specifically, if the P-type electrode 28 is divided into a contact area that is contact with the transparent conductive layer 27 and a non-contact area that is not in contact with the transparent conductive layer 27, an area of the non-contact area is preferably 0.15% to 80% of the contact area.

The region of the transparent conductive layer 27 disposed with the plurality of holes 29 may extend to correspond to the current block layer 26. That is, the transparent conductive layer 27 at a part that corresponds to the current block layer 26 may be disposed with the plurality of holes 29 to further reduce the area of the transparent conductive layer 27. Without affecting electrical characteristics, a maximum reduction on the area of the transparent conductive layer 27 promotes the increase in the light extraction efficiency. Preferably, a ratio of a width of the plurality of holes 29 (i.e., the non-contact area) to a width of the current block layer 26 is 0.1 to 1.

For the sake of manufacturing convenience, the plurality of holes 29 have a constant size area. Further, as the size of the LED 100 becomes larger, the number of the plurality of holes 29 may get larger, so as to act in response to the size change of the LED 100 by increasing the number of the plurality of holes 29. Further, for electrical considerations, the plurality of holes 29 are evenly distributed at the region corresponding to the P-type electrode 28.

If the P-type electrode 28 is divided into a P-type joint 281 and a P-type extension electrode 282 that are connected to each other, the plurality of holes 29 may be disposed at a region corresponding to the P-type joint 281 and the P-type extension electrode 282; that is, the plurality of holes 29 may be disposed above the P-type joint 281 or the P-type extension electrode 282. In practice, the P-type joint 281 is generally a circle, and the P-type extension electrode 282 is generally a long quadrilateral. The circular P-type joint 281 connects to an external voltage, and the long quadrilateral P-type extension electrode 282 helps distributing the current.

Regarding the actual application structure, the structure of the present invention is formed by stacking one layer on top of another. After forming the plurality of holes 29 at the transparent conductive layer 27, the P-type electrode 28 is then stacked and formed on the transparent conductive layer 27. Thus, at the region of the plurality of holes 29, the P-type electrode 28 on the current block layer 26 directly comes into contact with the current block layer 26.

The transparent conductive layer 27 may be a metal film, e.g., an aluminum (Al), gold (Au), silver (Ag), nickel (Ni) or copper (Cu) film, or a transparent oxide film, e.g., indium tin oxide (In2O3:Sn, or ITO), aluminum-doped zinc oxide (ZnO:Al, or AZO), or fluoride-doped tin oxide (SnO2:F, or FTO). The substrate 20 may be commonly made of a material having a good heat conductivity such as silicon. The reflecting layer 21 may be made of a material having a high reflection rate such as silver or aluminum, or a distributed Bragg reflector (DBR). The N-type electrode 22 and the P-type electrode 28 are commonly made of a metal such as copper. The N-type semiconductor layer 23, the light emitting layer 24 and the P-type semiconductor layer 25 are made of BaN-based epitaxy doped with different metals. The current block layer 26 is commonly made of a transparent oxide such as silicon dioxide.

Figure 3:
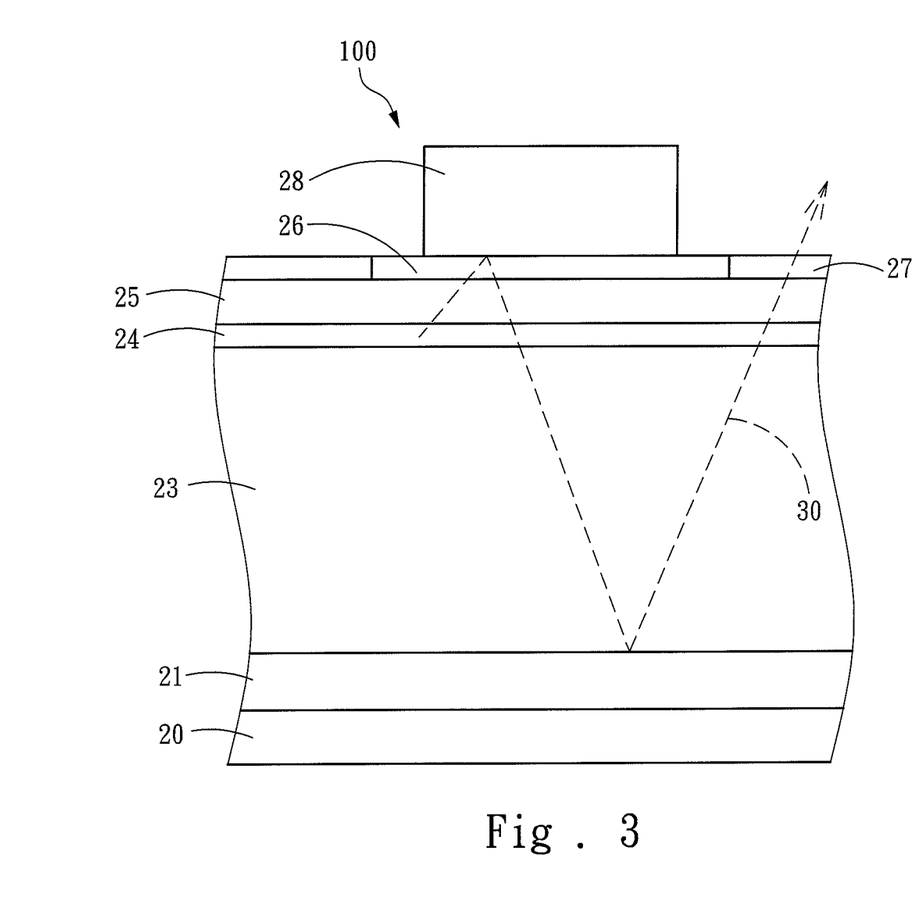
FIG. 3 is a sectional view of a structure of an LED of the present invention.
Figure 4:
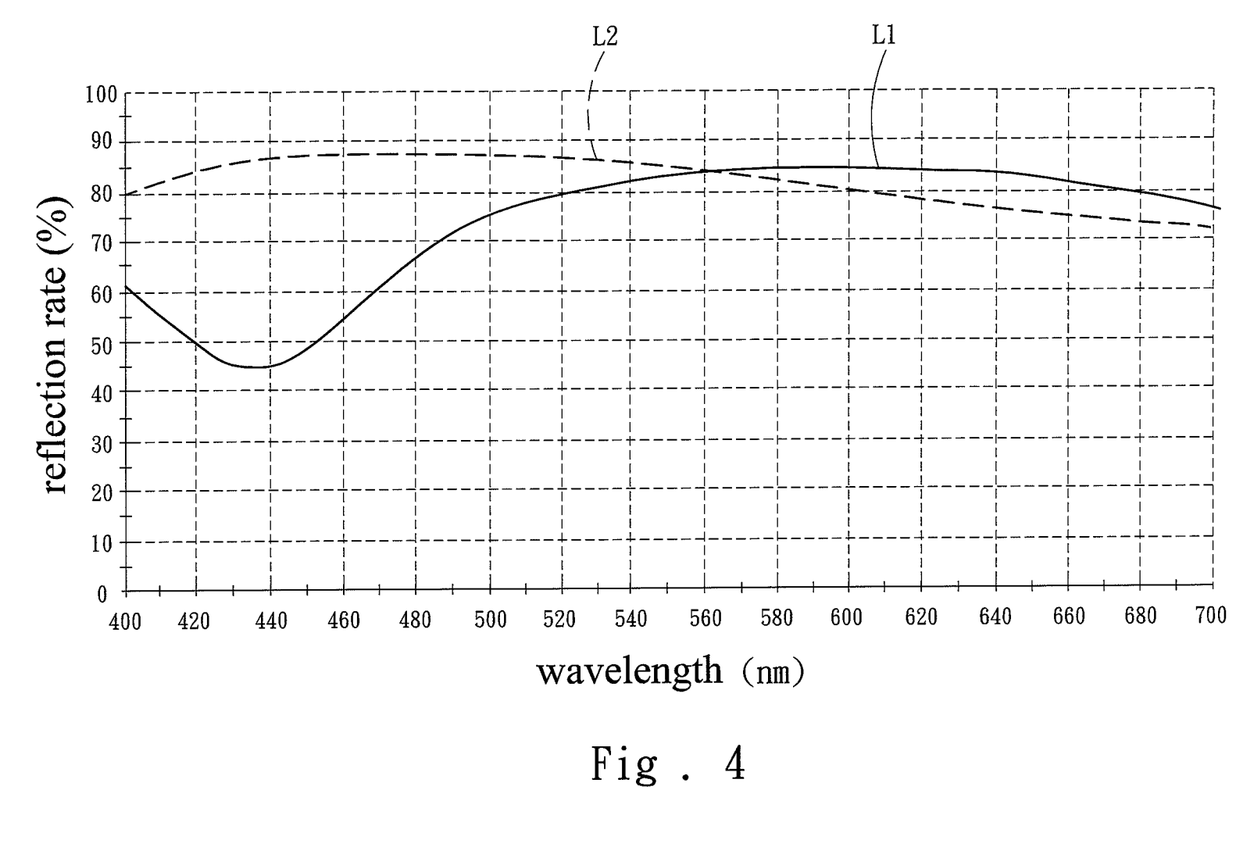
FIG. 4 is a diagram of simulated data for an incident angle of 0 degree of the present invention.
Figure 5:
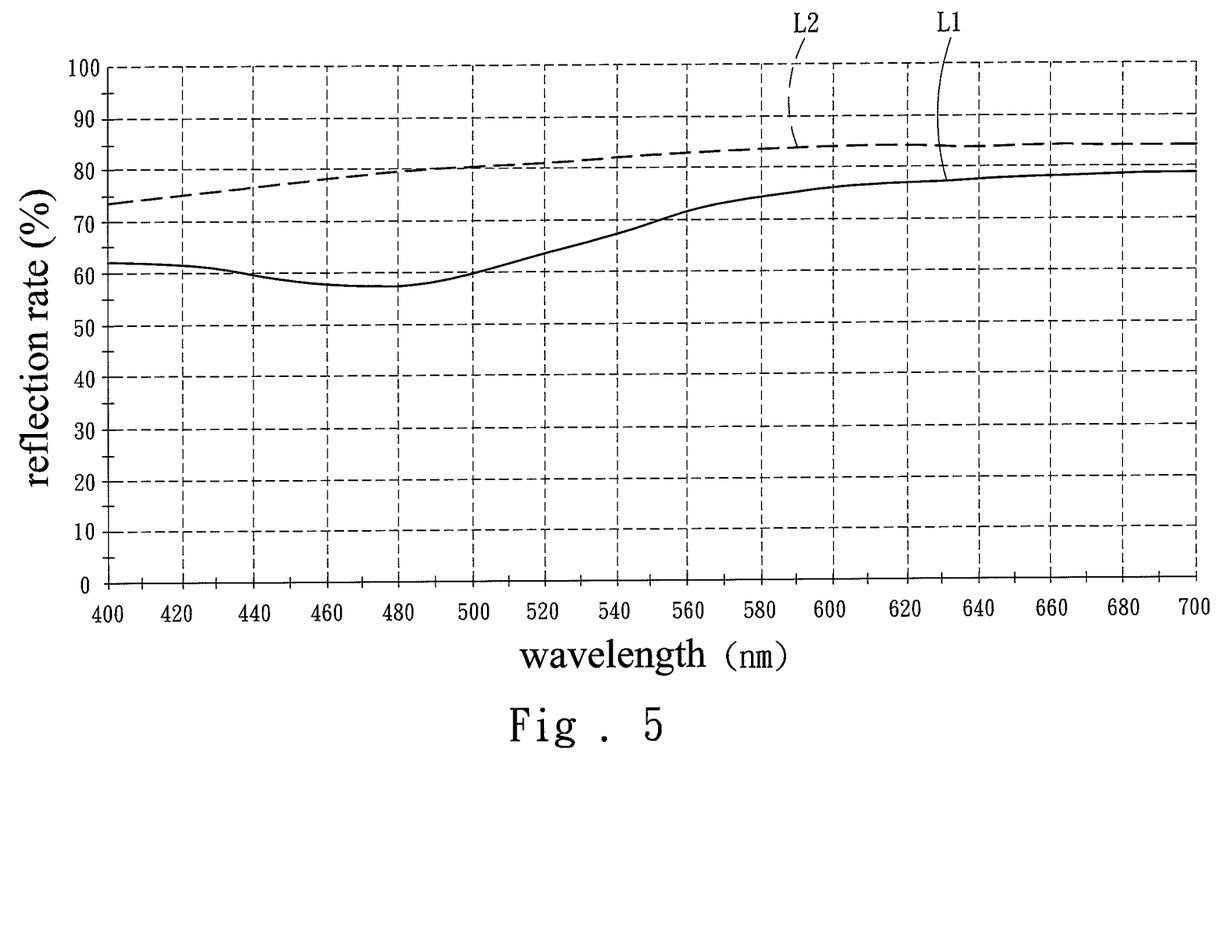
FIG. 5 is a diagram of simulated data for an incident angle of 30 degrees of the present invention.

FIG. 3 shows a section view of a structure of an LED of the present invention. FIG. 4 and FIG. 5 show diagrams of simulated data of the reflection rate of an excited light 30 having different incident angles of the present invention. The data is divided into a solid line L1 representing data with the transparent conductive layer 27, and a dotted line L2 representing data without the transparent conductive layer 27. Taking a 0-degree incident angle (vertically incident) for example, as shown in FIG. 4, the solid line L1 indicates that the reflection rate with the transparent conductive layer 27 for a 430 nm to 440 nm waveband is only about 45%, whereas the dotted line L2 indicates that the reflection rate without the transparent conductive layer 27 gets as high as about 85%. Similarly, for a 30-degree incident angle, as shown in FIG. 5, the solid line L1 indicates that the reflection rate with the transparent conductive layer 27 is about 60% to 80%, whereas the dotted line L2 indicates that the reflection rate without the transparent conductive layer 27 gets as high as about 75% to 85%.

It is apparent from the above data that, the reflection rate of the excited light is increased by removing the transparent conductive layer 27, which is in equivalence decreasing the amount of light absorbed by the transparent conductive layer 27 to increase the overall light extraction efficiency. More specifically, the transparent conductive layer 27 is provided with the plurality of holes 29 at the region corresponding to the P-type electrode 28. When the excited light 30 generated by the light emitting layer 24 enters the region of the transparent conductive layer 27 corresponding to the P-type electrode 28 via the region of the plurality of holes 29, the transparent conductive layer 27 is prevented from absorbing the light, and the excited light 30 can be effectively reflected. The reflected excited light 30 is then reflected by the reflecting layer 21 to make exit via parts without the P-type electrode 28.

In conclusion, the present invention at least includes following technical features and effects.

1. By partially removing the transparent conductive layer corresponding to the P-type electrode and partially keeping the transparent conductive layer for electrically connecting the P-type electrode, the area of the transparent conductive layer is reduced. Thus, when the excited light from the light emitting layer exits after having been reflected for a number of times, the amount of light absorbed by the transparent conductive layer can be reduced to further increase the final light extraction efficiency.

2. By disposing the plurality of holes at the transparent conductive layer at a region corresponding to the P-type electrode, the reflection rate of light at that region is effectively enhanced. Thus, the excited light entering the P-type electrode can be effectively reflected and exit after having been reflected for a number of times, thereby increasing the overall light emitting efficiency.

What is claimed is:

1. A transparent conductive layer structure of a light emitting diode (LED), applied to an LED, the LED comprising a reflecting layer, an N-type electrode, an N-type semiconductor layer, a light emitting layer, a P-type semiconductor layer, a current block layer, a transparent conductive layer and a P-type electrode that are stacked on a substrate; the reflecting layer located on the substrate, the N-type semiconductor layer located on the reflecting layer, the N-type semiconductor layer comprising divided areas respectively connected to the N-type electrode and the light emitting layer, the P-type semiconductor layer located on the light emitting layer, the current block layer located on the P-type semiconductor layer and having a pattern corresponding to and completely covering the P-type electrode, the transparent conductive layer covering the current block layer and connected to the P-type semiconductor layer, the P-type electrode located on the transparent conductive layer; the transparent conductive layer structure being characterized that:

at a region corresponding to the P-type electrode, the transparent conductive layer is disposed with a plurality of holes.

2. The transparent conductive layer structure of an LED of claim 1, wherein the region of the transparent conductive layer disposed with the plurality of holes is extended to correspond to the current block layer.

3. The transparent conductive layer structure of an LED of claim 2, wherein a ratio of a width of the plurality of holes to a width of the current block layer is 0.1 to 1.

4. The transparent conductive layer structure of an LED of claim 1, wherein the P-type electrode is divided into a contact area that is in contact with the transparent conductive layer and a non-contact area that is not in contact with the transparent conductive layer, an area of the non-contact area being 0.15% to 80% of that of the contact area.

5. The transparent conductive layer structure of an LED of claim 1, wherein the plurality of holes have a constant area size, and a number of the plurality of holes gets larger as a size of the LED becomes larger.

6. The transparent conductive layer structure of an LED of claim 1, wherein the plurality of holes are evenly distributed on the region corresponding to the P-type electrode.

7. The transparent conductive layer structure of an LED of claim 1, wherein the P-type electrode is divided into a P-type joint and a P-type extension electrode that are connected to each other, and the plurality of holes are disposed on the region corresponding to the P-type joint and the P-type extension electrode.

8. The transparent conductive layer structure of an LED of claim 7, wherein the P-type joint is a circle, and the P-type extension electrode is a long quadrilateral.

9. The transparent conductive layer structure of an LED of claim 1, wherein at the region with the plurality of holes, the P-type electrode is in direct contact with the current block layer.

10. The transparent conductive layer structure of an LED of claim 1, wherein the transparent conductive layer is made of indium tin oxide (ITO), aluminum-doped zinc oxide (AZO) or fluoride-doped tin oxide (FTO).

* * * * *